(12) United States Patent
Andle et al.

(10) Patent No.: US 10,794,736 B2
(45) Date of Patent: Oct. 6, 2020

(54) ELIMINATION OF FLOATING POTENTIAL WHEN MOUNTING WIRELESS SENSORS TO INSULATED CONDUCTORS

(71) Applicant: Rosemount Inc., Shakopee, MN (US)

(72) Inventors: Jeffrey C. Andle, Rockledge, FL (US); Thomas M. Cunneen, Beverly, MA (US); Jonathan P. Murray, Chemlsford, MA (US); David Lane, Beverly, MA (US); Maly Chap, Lowell, MA (US); Nicholas S. Barbas, Billerica, MA (US); Zhi Hans Song, Toronto (CA)

(73) Assignee: ROSEMOUNT INC., Shakopee, MN (US)

( * ) Notice: Subject to any disclaimer, the term of this patent is extended or adjusted under 35 U.S.C. 154(b) by 0 days.

(21) Appl. No.: 16/227,478

(22) Filed: Dec. 20, 2018

(65) Prior Publication Data

US 2019/0285441 A1 Sep. 19, 2019

Related U.S. Application Data

(60) Provisional application No. 62/643,497, filed on Mar. 15, 2018.

(51) Int. Cl.
*G06K 19/07* (2006.01)
*G01D 11/24* (2006.01)
(Continued)

(52) U.S. Cl.
CPC ............ *G01D 11/245* (2013.01); *G01H 1/00* (2013.01); *G01R 1/04* (2013.01); *G01R 1/0408* (2013.01);
(Continued)

(58) Field of Classification Search
CPC ........ G06K 19/00; G06K 19/04; G06K 19/06; G06K 19/07
(Continued)

(56) References Cited

U.S. PATENT DOCUMENTS 3,938,034 A 2/1976 Japenga
4,904,996 A 2/1990 Fernandes
(Continued)

FOREIGN PATENT DOCUMENTS

CA 2 192 856 9/2000
CA 2 455 206 5/2012
(Continued)

OTHER PUBLICATIONS

Office Action from Chinese Patent Application No. 201920428356.3, dated Nov. 7, 2019.
(Continued)

*Primary Examiner* — Edwyn Labaze
(74) *Attorney, Agent, or Firm* — Westman, Champlin & Koehler, P.A.

(57) ABSTRACT

A sensor package includes at least one conductive trace providing a voltage common and a base supporting the at least one conductive trace. A conductive extension extends from the base so as to contact a conductor of an insulated conductor when the sensor package is mounted on an insulator of the insulated conductor and thereby provide an electrical connection between the conductive trace providing the voltage common and the conductor.

37 Claims, 10 Drawing Sheets

(51) Int. Cl.
| | |
|---|---|
| *H01R 4/2404* | (2018.01) |
| *H01R 4/2483* | (2018.01) |
| *H01R 4/48* | (2006.01) |
| *H01R 43/01* | (2006.01) |
| *G01H 1/00* | (2006.01) |
| *H01R 4/50* | (2006.01) |
| *G01R 31/327* | (2006.01) |
| *G01R 1/04* | (2006.01) |
| *G01R 15/14* | (2006.01) |
| *G01R 31/12* | (2020.01) |
| *G01R 31/08* | (2020.01) |

(52) U.S. Cl.
CPC ......... *G01R 1/0466* (2013.01); *G01R 15/142* (2013.01); *G01R 31/085* (2013.01); *G01R 31/086* (2013.01); *G01R 31/1209* (2013.01); *G01R 31/1272* (2013.01); *G01R 31/327* (2013.01); *G06K 19/0723* (2013.01); *H01R 4/2404* (2013.01); *H01R 4/2483* (2013.01); *H01R 4/489* (2013.01); *H01R 4/5083* (2013.01); *H01R 43/01* (2013.01)

(58) Field of Classification Search
USPC ........................................ 235/492, 487, 375
See application file for complete search history.

(56) References Cited

U.S. PATENT DOCUMENTS

| | | | |
|---|---|---|---|
| 4,937,763 | A | 6/1990 | Mott |
| 5,063,931 | A | 11/1991 | Leavitt |
| 5,612,930 | A | 3/1997 | Hazony et al. |
| 5,815,352 | A | 9/1998 | Mackenzie |
| 5,933,012 | A | 8/1999 | Bengtsson et al. |
| 6,002,260 | A | 12/1999 | Lau et al. |
| 6,172,862 | B1 | 1/2001 | Jonnatti et al. |
| 6,297,642 | B1 | 10/2001 | Shibahara et al. |
| 6,424,162 | B1 | 7/2002 | Rokunohe et al. |
| 6,483,316 | B2 | 11/2002 | Kato et al. |
| 6,774,639 | B1 | 8/2004 | Unsworth |
| 7,071,701 | B2 | 7/2006 | Roman et al. |
| 7,577,535 | B2 | 8/2009 | Anderson et al. |
| 7,676,333 | B2 | 3/2010 | Younsi et al. |
| 7,912,660 | B2 | 3/2011 | Anderson et al. |
| 8,271,213 | B2 | 9/2012 | Xu et al. |
| 8,466,690 | B2 | 6/2013 | Stewart et al. |
| 9,372,221 | B1 | 6/2016 | Bierman |
| 9,733,285 | B2 | 8/2017 | Kennedy et al. |
| 9,753,080 | B2 | 9/2017 | Andle et al. |
| 2003/0093390 | A1 | 5/2003 | Onoda et al. |
| 2005/0035768 | A1 | 2/2005 | Rabach et al. |
| 2005/0194979 | A1 | 9/2005 | Roman et al. |
| 2007/0059986 | A1 | 3/2007 | Rockwell |
| 2007/0272827 | A1* | 11/2007 | Heo, II ............. H01L 27/14618 |
| | | | 250/208.1 |
| 2008/0133154 | A1 | 6/2008 | Krauss |
| 2008/0204950 | A1 | 8/2008 | Zhou et al. |
| 2008/0309351 | A1 | 12/2008 | Steward et al. |
| 2009/0251308 | A1 | 10/2009 | Schweitzer, III et al. |
| 2010/0072355 | A1 | 3/2010 | Schweitzer, III et al. |
| 2010/0114392 | A1 | 5/2010 | Lancaster |
| 2010/0271152 | A1* | 10/2010 | Sabah ................... G01L 19/083 |
| | | | 333/193 |
| 2011/0234215 | A1* | 9/2011 | Ausserlechner ....... G01R 15/20 |
| | | | 324/244 |
| 2011/0234362 | A1* | 9/2011 | Koehler ................. F03G 7/065 |
| | | | 337/290 |
| 2011/0249370 | A1 | 10/2011 | Nayak et al. |
| 2012/0134058 | A1 | 5/2012 | Pamer et al. |
| 2012/0185185 | A1 | 7/2012 | Bae et al. |
| 2013/0192376 | A1 | 8/2013 | Zhou et al. |
| 2013/0234726 | A1 | 9/2013 | Hobelsberger |
| 2014/0270205 | A1 | 9/2014 | Miller |
| 2015/0043310 | A1* | 2/2015 | Maas ..................... G01V 13/00 |
| | | | 367/188 |
| 2015/0160098 | A1 | 6/2015 | Noda et al. |
| 2015/0253362 | A1 | 9/2015 | Louzir et al. |
| 2015/0260778 | A1 | 9/2015 | Park et al. |
| 2015/0317229 | A1 | 11/2015 | Wada et al. |
| 2016/0209454 | A1 | 7/2016 | McCammon et al. |
| 2016/0209459 | A1 | 7/2016 | Tozzi et al. |
| 2016/0231375 | A1 | 8/2016 | Roemer et al. |
| 2017/0038424 | A1 | 2/2017 | Ikegami et al. |
| 2018/0062003 | A1* | 3/2018 | Luan ..................... G01S 7/4813 |
| 2018/0252760 | A1 | 9/2018 | Andle et al. |
| 2018/0356357 | A1* | 12/2018 | Samarao .............. G01N 27/127 |
| 2019/0250198 | A1* | 8/2019 | Kubena ................. H04B 17/21 |

FOREIGN PATENT DOCUMENTS

| | | |
|---|---|---|
| CA | 2 821 795 | 7/2012 |
| CN | 203025311 | 6/2012 |
| DE | 26 41 047 | 3/1978 |
| DE | 10 2015 113804 | 2/2017 |
| EP | 0 061 254 | 10/1985 |
| EP | 1 566 646 | 8/2005 |
| EP | 1 222 472 | 8/2006 |
| EP | 2 063 276 | 5/2009 |
| EP | 2 437 075 | 4/2012 |
| EP | 2 24 364 | 5/2012 |
| EP | 2 324 364 | 5/2012 |
| EP | 2 608 338 | 6/2013 |
| EP | 2 763 259 | 6/2014 |
| EP | 3 121 610 | 1/2017 |
| EP | 3 141 911 | 3/2017 |
| FR | 1 181 357 | 6/1959 |
| GB | 2 321 713 | 5/1998 |
| JP | 2002-131366 | 5/2002 |
| JP | 2004-61358 | 2/2004 |
| JP | 2011-095036 | 5/2011 |
| KR | 10-2013-0060442 | 6/2013 |
| KR | 10-1280763 | 7/2013 |
| KR | 10-1285146 | 7/2013 |
| RU | 2 483 315 | 5/2013 |
| TW | 201 340 135 | 10/2013 |
| WO | WO 2007/070942 | 6/2007 |
| WO | WO 2013/038210 | 3/2013 |
| WO | WO 2013/124886 | 8/2013 |
| WO | WO 2013/131948 | 9/2013 |
| WO | WO 2013/136793 | 9/2013 |
| WO | WO 2013/139131 | 9/2013 |
| WO | WO 2014/053187 | 4/2014 |
| WO | WO 2017/053187 | 4/2014 |
| WO | WO 2014/189975 | 11/2014 |
| WO | WO 2017/029415 | 2/2017 |

OTHER PUBLICATIONS

Notification of Transmittal of the International Search Report and the Written Opinion of the International Searching Authority from International Application No. PCT/US2019/053726, dated Dec. 17, 2019.
Notification of Transmittal of the International Search Report and the Written Opinion of the International Searching Authority from International Application No. PCT/US2019/027669, dated Jul. 23, 2019.
Communication from European Patent Application No. 18712051.4, dated Sep. 18, 2019.
"Partial Discharge Theory and Applicants to Electrical Systems", by G. Paoletti et al., IEEE IAS Pulp and Paper Industry Conference in Seattle, WA, 1999.
"Advantages of Continuous Monitoring of Partial Discharges in Rotating Equipment and Switchgear", by C. Kane et al., 8 pgs.
"Continuous Partial Discharge Monitoring with Assessed Condition Trending System (ACTS)", by C. Wendel et al., Cigre-Mexico, 2001.
"Ubiquitous UHF Monitoring System for Partial Discharge Detection and Trending", by J. Andle et al., IEEE, 2015.
Oil, Gas, and Petrochemicals Users Group Meeting, 2012, 2 pgs.

(56) References Cited

OTHER PUBLICATIONS

Notification of Transmittal of the International Search Report and the Written Opinion of the International Searching Authority from PCT/US2018/020585, dated Jun. 25, 2018.
"Ubiquitous, On-Line, Partial Discharge Trending", by J. Andle et al., Electrical Insulation Conference (EIC) San Antonio, TX, Jun. 2018, IEEE, 6 pgs.
"Using Continuous Temperature Monitoring to Avoid Critical Asset Failure" by J. Andle et al., Electric Light & Power, Jul. 2015, 7 pgs.
"Partial Discharge Testing: A Progress Report" by V. Warren, PD Progress Report, IRMC 2013, 11 pgs.
"Ameren Illinois Smart Grid Test Bed Evaluation", by B. Snyder et al., Quanta Technology, LLC, 2017, 30 pgs.
"Analytics Use Cases and Foundational Components", IEEE BDA Webinar Series: Big Data & Analytics for Power Systems, Dec. 8, 2017, 12 pgs.
Invitation to Pay Additional Fees from PCT/US2018/057461, dated Jan. 23, 2019.
"Preventing Transmission Line Damage Caused by Ice with Smart On-Line Conductor Monitoring", by N. Gubeljak et al., IEEE, 2016, 10 pgs.
"Dynamic Thermal Ratings Realize Circuit Load Limits", by D. Douglass et al., IEEE Computer Applications in Power, 2000, 8 pgs.
"Real-Time Monitoring and Dynamic Thermal Rating of Power Transmission Circuits", by D. Douglass et al., IEEE Transactions on Power Delivery, vol. 11, No. 3, Jul. 1996, 12 pgs.
"Network Planning Evaluation Implementing Time Varying Thermal Ratings", by A. Kapetanaki et al., IEEE, 2014, 6 pgs.
"Electrothermal Coordinating in Cable Based Transmission Grids", by R. Olsen et al., IEEE Transactions on Power Systems, vol. 28, No. 4, Nov. 2013, 8 pgs.
Notification of Transmittal of the International Search Report and the Written Opinion of the International Searching Authority from PCT/US2015/064385, dated Mar. 30, 2016.
"Advanced Measuring System for the Analysis of Dielectric Parameters including PD Events", by Lemke et al, Electrical Insulation Conference and Electrical Manufacturing & Coil Winding Conference, Oct. 1999.
Office Action from U.S. Appl. No. 14/961,321 dated Jan. 10, 2017.
Notification of Transmittal of the International Search Report and the Written Opinion of the International Searching Authority from PCT/US2018/057461, dated Apr. 18, 2019.
Notification of Transmittal of the International Search Report and the Written Opinion of the International Searching Authority from PCT/US2019/018392, dated Jun. 3, 2019.

\* cited by examiner

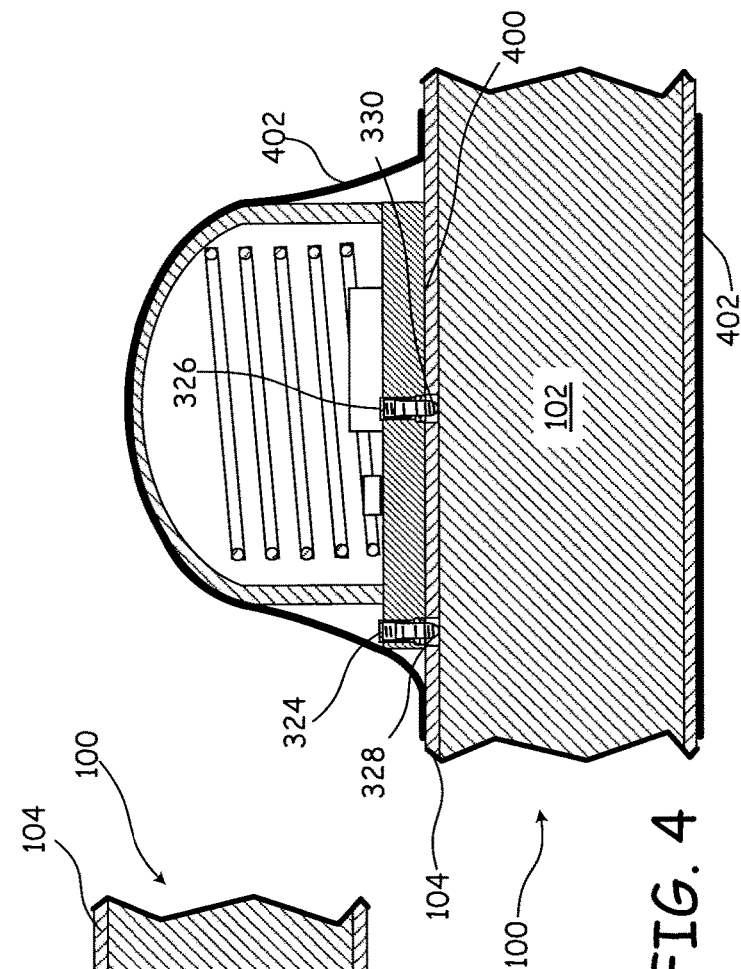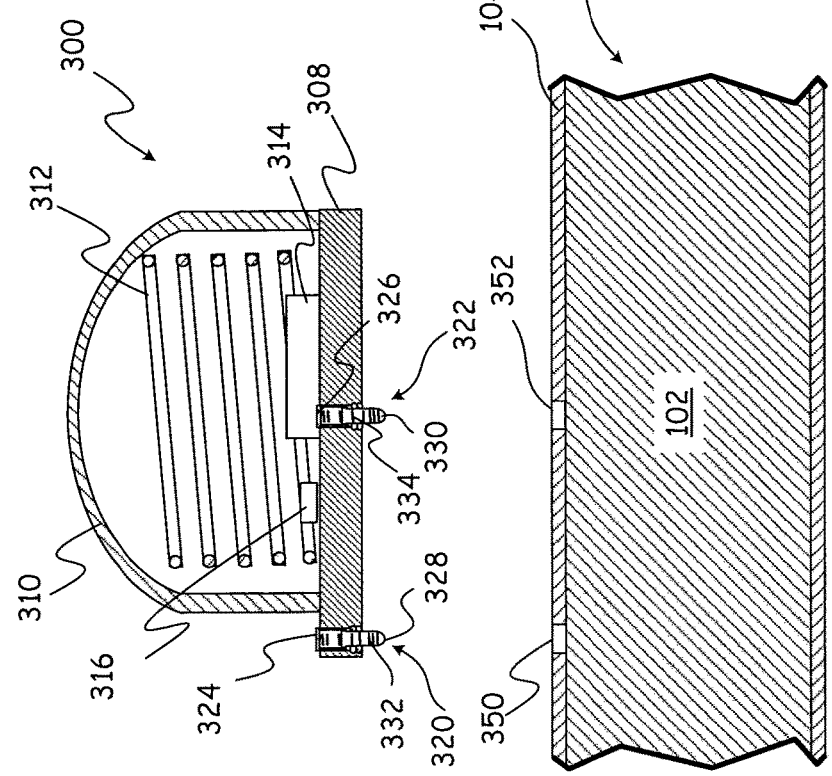

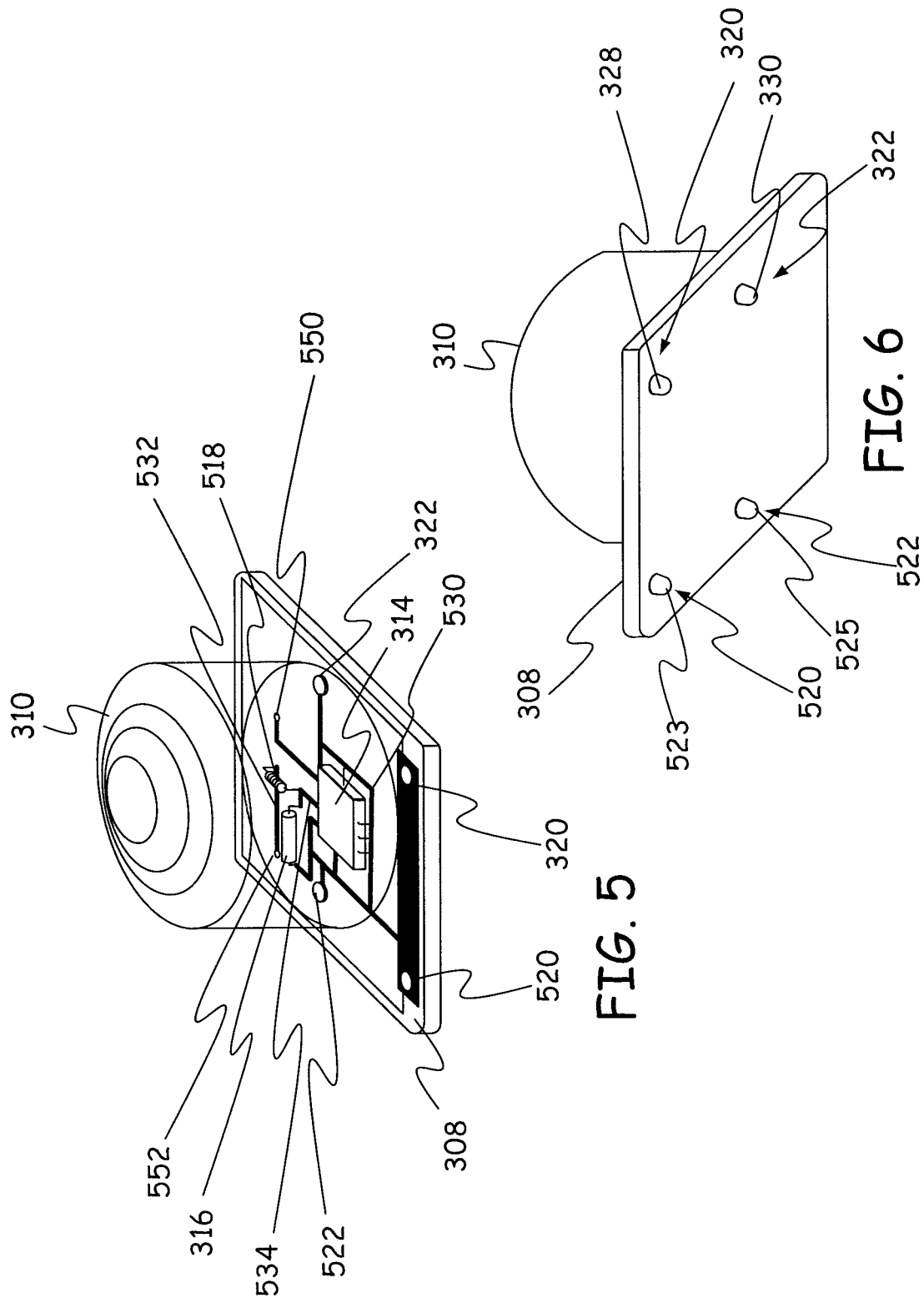

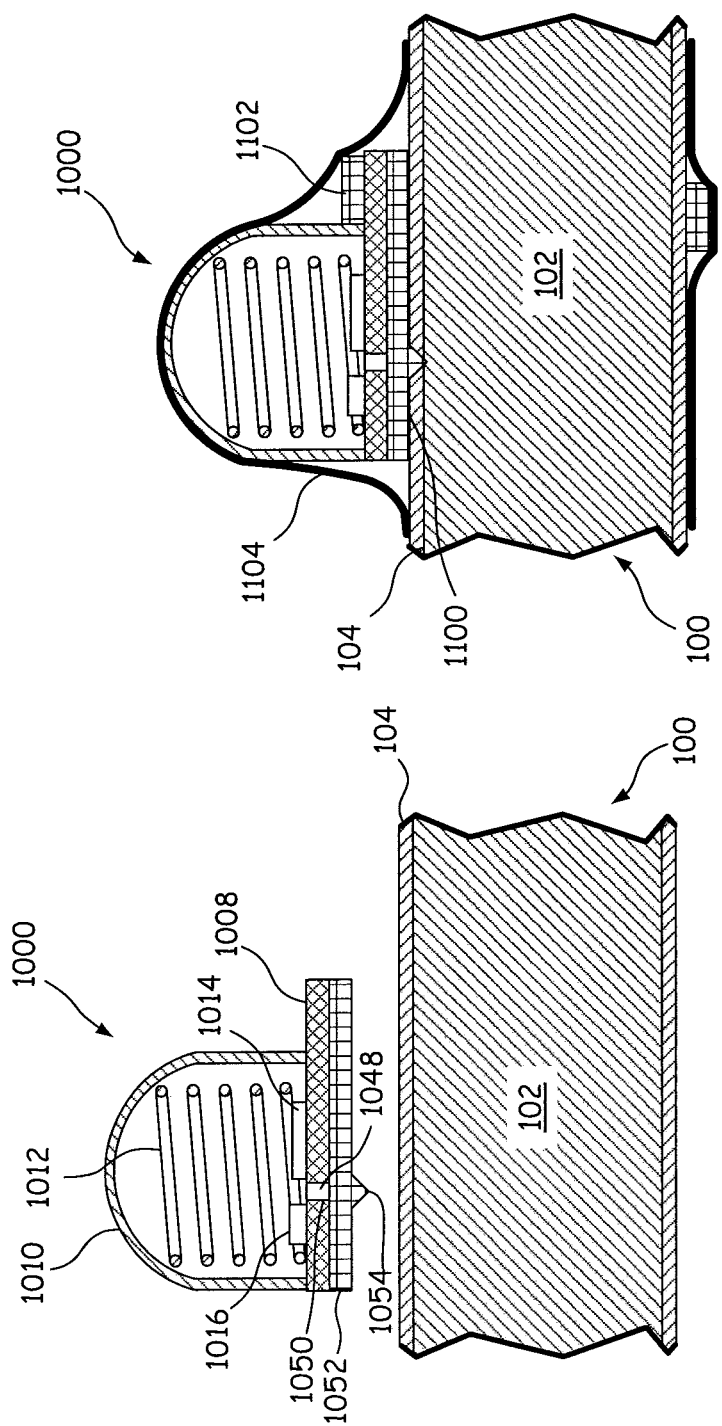

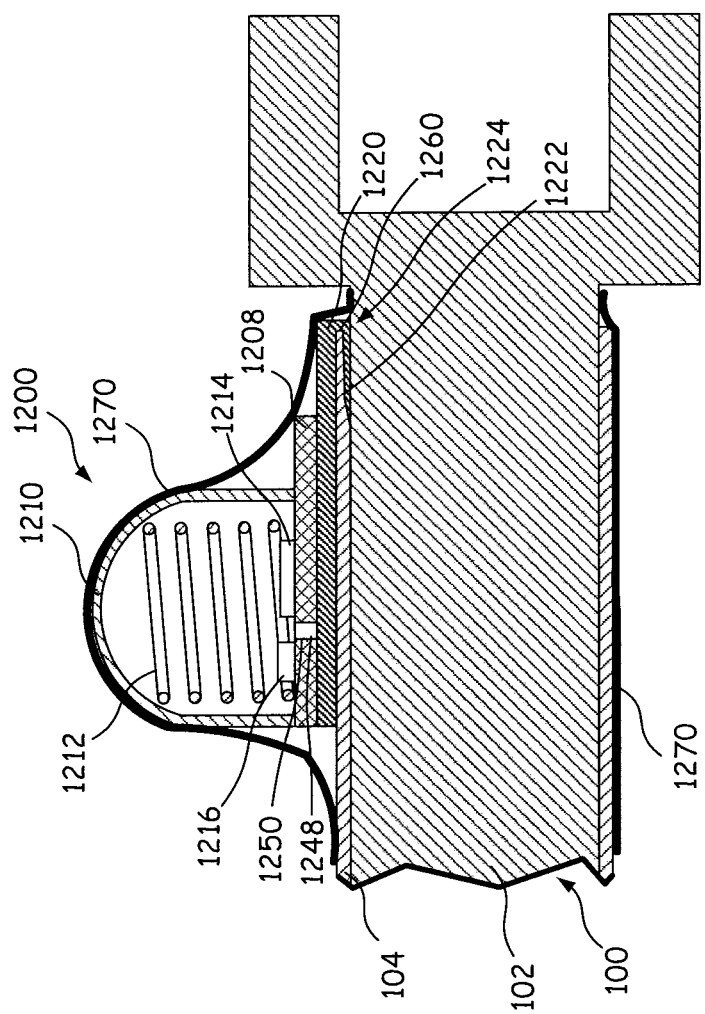

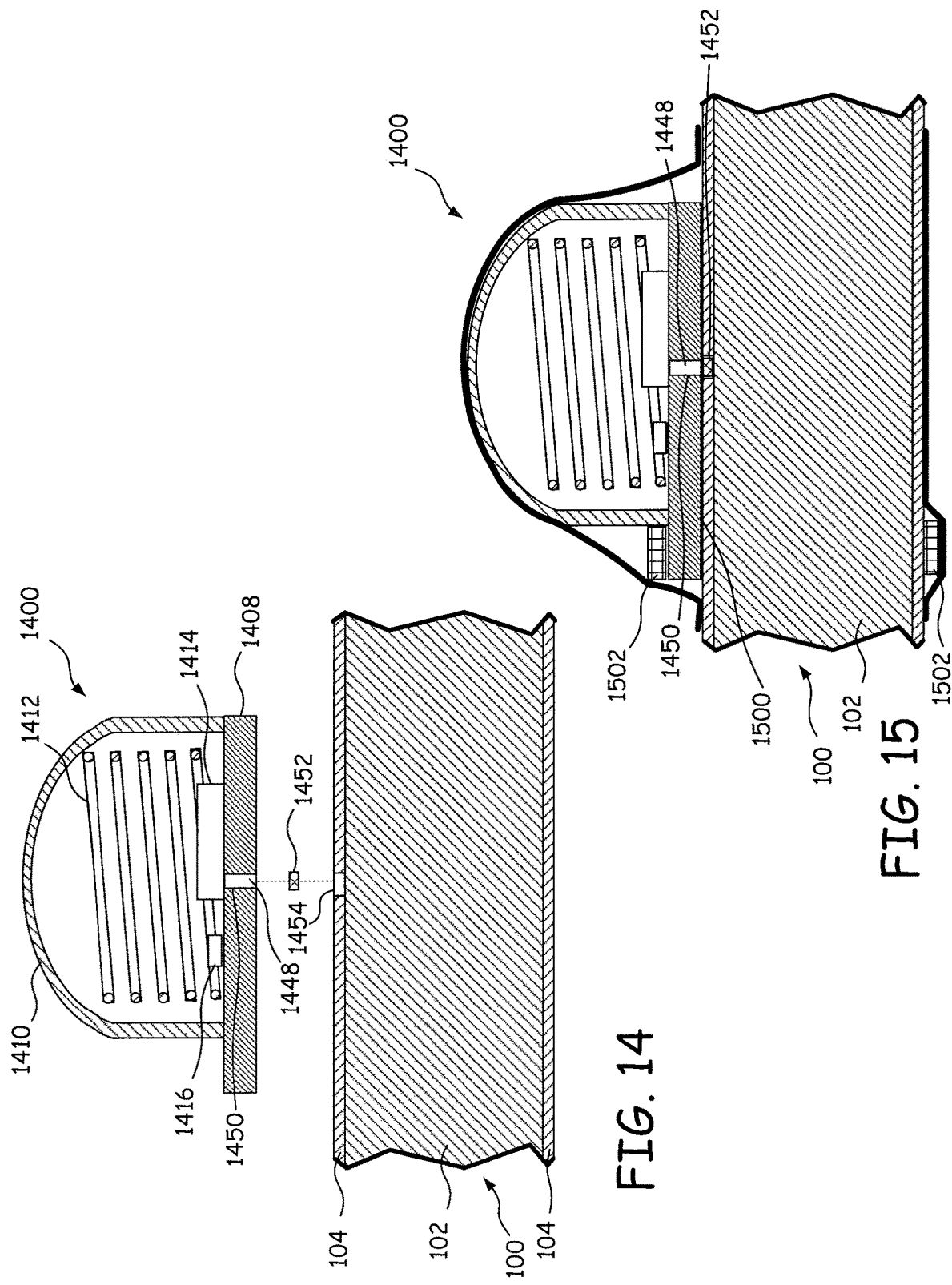

ELIMINATION OF FLOATING POTENTIAL WHEN MOUNTING WIRELESS SENSORS TO INSULATED CONDUCTORS

CROSS-REFERENCE OF RELATED APPLICATION

The present application is based on and claims the benefit of U.S. provisional patent application Ser. No. 62/643,497, filed Mar. 15, 2018, the content of which is hereby incorporated by reference in its entirety.

BACKGROUND

Systems for electric power generation and transmission are susceptible to damage when unwanted discharge events such as arcing, partial discharge and corona discharge occur. A variety of sensors have been developed to monitor the health of electric power assets such as temperature sensors, humidity sensors, and partial discharge sensors. In the past, such sensors have been mounted directly to uninsulated medium (1 kV to 35 kV) or high voltage (above 35 kV) buswork to accurately measure the temperature of the buswork.

The discussion above is merely provided for general background information and is not intended to be used as an aid in determining the scope of the claimed subject matter. The claimed subject matter is not limited to implementations that solve any or all disadvantages noted in the background.

SUMMARY

A sensor package includes at least one conductive trace providing a voltage common and a base supporting the at least one conductive trace. A conductive extension extends from the base so as to contact a conductor of an insulated conductor when the sensor package is mounted on an insulator of the insulated conductor and thereby provide an electrical connection between the conductive trace providing the voltage common and the conductor.

In accordance with a further embodiment, a sensor module includes a conductive trace layer comprising an electrical common conductive trace and an electrical component connected to the electrical common conductive trace. A conductive extension is configured to extend through an opening in an insulator of an insulated conductor to make a connection between a conductor of the insulated conductor and the electrical common conductive trace.

In accordance with a still further embodiment, a method includes securing a sensor module to an insulated conductor such that a portion of the sensor module makes contact with a conductor of the insulated conductor.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 3 is a sectional view of a sensor module in accordance with one embodiment prior to engaging an insulated conductor.

FIG. 4 is a sectional view of the sensor module of FIG. 3 fully mounted to the insulated conductor.

FIG. 5 is a top perspective view of the sensor module of FIG. 3.

FIG. 6 is a bottom perspective view of the sensor module of FIG. 3.

FIG. 10 shows a sectional view of a third embodiment of the sensor module before mounting to an insulated conductor.

FIG. 11 shows a sectional view of sensor module of FIG. 10 fully mounted to the insulated conductor.

FIG. 12 shows a sectional view of a fourth embodiment of the sensor module fully mounted to an insulated conductor.

FIG. 14 shows a sectional view of a sixth embodiment of the sensor module before being mounted to an insulated conductor.

FIG. 15 shows a sectional view of the sensor module of FIG. 13 fully mounted to the insulated conductor.

DETAILED DESCRIPTION OF ILLUSTRATIVE EMBODIMENTS

Mounting a sensor to an uninsulated conductor, such as buswork, often requires that an entire substation containing the buswork be de-energized so that the sensor can be safely mounted to the exposed conductor. Such de-energizing of the substation results in significant downtime for the businesses that rely on the substation to provide energy.

Within some medium and high voltage electric transmission systems, circuit breakers are provided that permit different portions of the transmission system to be isolated from each other. Some of the circuit breakers include insulated conductors that can be de-energized by breaking the connection controlled by the circuit breaker. Because the circuit breaker arms can be de-energized without de-energizing the entire substation, placing sensors on the insulated conductors of a circuit breaker would appear to be an attractive alternative to placing the sensors directly on exposed buswork.

Figure 1:
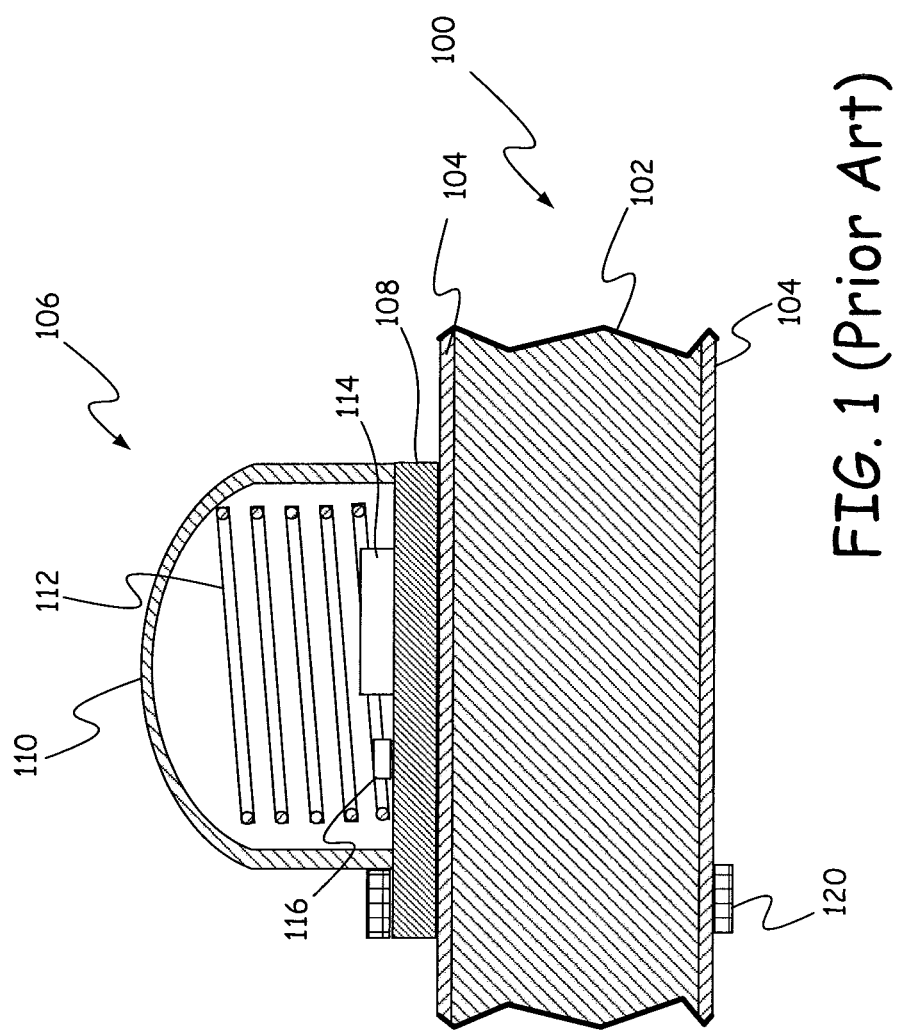
FIG. 1 is a sectional view of a sensor on an insulated conductor under the prior art.

FIG. 1 provides a sectional view of a sensor module 106 mounted on an insulated conductor 100, such as an insulated circuit breaker for a medium voltage power system, which consists of a conductor 102 encased by an insulator 104. Sensor module 106 includes a base 108 that supports a base cover 110, antenna 112 and circuit components 114 and 116 on its top surface. Antenna 112 and circuit components 114 and 116 are mounted within cover 110 and are connected to conductive traces formed on a top surface of a base 108. At least one of the conductive traces provides a common voltage or electrical common, which sometimes is referred to as a circuit ground even though the common voltage may not be at earth ground. Circuit component 114 includes a sensor such as a temperature sensor, humidity sensor, or partial discharge sensor, for example. A strap or tie 120 extends around insulated conductor 100 and base 108 to fasten sensor module 106 to insulated conductor 100.

As shown in FIG. 1, the conductive traces on the top surface of base 108 are isolated from conductor 102 by insulator 104. As a result, the common voltage on those conductive traces have a floating voltage potential relative to insulated conductor potential.

Figure 2:
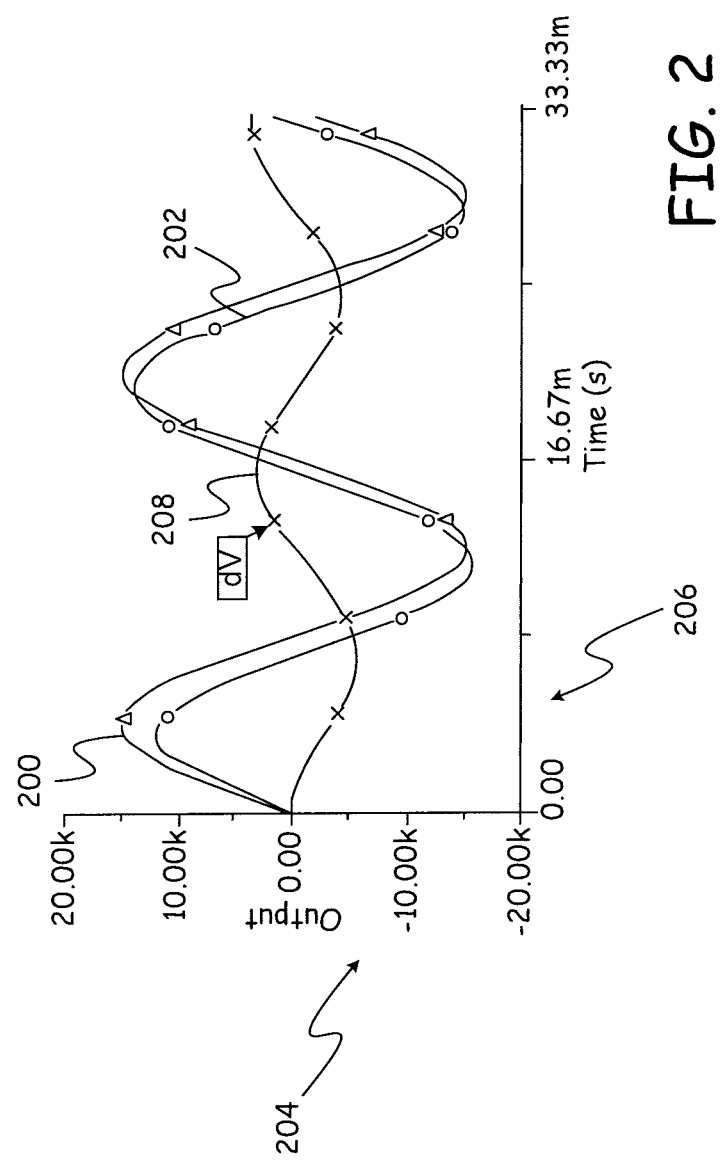
FIG. 2 provides graphs of voltage on an insulated conductor and a sensor common voltage when the common voltage floats relative to the conductor voltage.

When conductor 102 carries an alternating voltage, changes in the voltage of conductor 102 induce a voltage in the conductive traces of sensor module 106 causing the common voltage to follow the voltage on conductor 102. For example, in FIG. 2, graph 200 shows the voltage on conductor 102 and graph 202 shows the common voltage of sensor module 106 over time, with voltage shown on vertical axis 204 and time shown on horizontal axis 206. As shown in FIG. 2, common voltage 202 on sensor module 106 leads voltage 200 on conductor 102 creating a voltage difference shown by graph 208. In some circumstances, this voltage difference can be large enough to trigger a partial discharge across insulator 104. Such partial discharges can damage insulator 104 and can mask other partial discharges taking place in other parts of the power system such that the sensor in sensor module 106 is unable to detect the other, potentially more significant, partial discharges.

To overcome these problems, the various embodiments provide extensions from the base of the sensor module that are designed to pass through or around the insulator on a medium or high voltage insulated conductor, such as an insulated circuit breaker, to reach the conductor. These extensions provide a conductive path from the conductor to the common voltage conductive traces on the base, thereby setting the common voltage to the voltage of the conductor. This removes the voltage difference between the common voltage and the conductor and reduces the chances of a partial discharge occurring due to the sensor module.

FIG. 3 provides a sectional view of a sensor module 300 in accordance with one embodiment prior to being positioned on insulated conductor 100. Sensor module 300 includes a base 308 that supports a cover 310, an antenna 312 and circuit components 314 and 316. Circuit components 314 and 316 and antenna 312 are mounted within cover 310 and are electrically connected to a layer of conductive traces on the top surface of base 308. The conductive traces include a common voltage, sometimes referred to as circuit ground. Component 314 includes at least one sensor such as a temperature sensor, a humidity sensor or a partial discharge sensor, for example. In accordance with some embodiments, the sensor is a surface acoustic wave sensor. Antenna 312 receives and transmits electromagnetic signals to allow for wireless communication between sensor module 300 and external devices. In addition, some of the energy in the received electromagnetic signals is used to power sensor module 300 such that sensor module 300 does not require a battery.

Extensions in the form of spring-loaded pins 320 and 322 extend through and below base 308. Spring-loaded pins 320 and 322 each have a three-part construction that includes a pinhead casing 324 and 326, respectively, a contact casing 328 and 330, respectively, and an internal spring 332 and 334, respectively. One end of the contact casing 328/330 is captured within the corresponding pinhead casing 324/326 and is allowed to move vertically within the pinhead casing 324/326. Internal springs 332 and 334 are positioned within the respective pinhead casing 324/326 and contact casing 328/330 to apply an outward force against the pinhead casing and the contact casing. Thus, in a resting position, internal springs 332 and 334 extend contact casings 328 and 330 out of pinhead casing 324 and 326 to the full extent allowed by the structure that captures the end of contact casing 328/330 within pinhead casing 324/326.

At least the exteriors of contact casings 328/330 and pinhead casings 324/326 are electrically conductive. In accordance with one embodiment, each of pinheads 324 and 326 are in contact with a conductive trace carrying the common voltage on the top of sensor module 300. Thus, pins 320 and 322 provide a conductive path to the conductive traces carrying the common voltage. In a preferred embodiment, holes 350 and 352 are at least partially filled with a conductive adhesive such as a silver loaded RTV silicone.

Prior to mounting base 308 to insulator 104, openings, such as openings 350 and 352, are made in insulator 104 to receive the ends of contact casings 328 and 330 of pins 320 and 322, respectively. As base 308 is placed on insulator 104, contact casings 328 and 330 enter openings 350 and 352, respectively, extending through the thickness of the removed insulator to make contact with conductor 102. As base 308 moves closer to insulator 104, pins 320 and 322 begin to compress by moving pinhead casings 324 and 326 downward along the exterior of contact casings 328 and 330 while further compressing springs 332 and 334.

In accordance with one embodiment, pinhead 324 is exposed when base 308 is initially mounted on insulator 104. This exposed pinhead can be used during mounting to ensure that an electrical connection has been established between the common voltage conductive trace and conductor 102. Specifically, a resistance probe can be placed between conductor 102 and pinhead 324 to measure the resistance of the connection of pin 320 and conductor 102.

One advantage of using spring-loaded pins 320 and 322 is that the length of the pins does not have to exactly match the thickness of insulator 104. Because pins 320 and 322 can be compressed, they can accommodate multiple different insulator thickness. Thus, for thicker insulators, pins 320 and 322 will be compressed a small amount while for thinner insulators, pins 320 and 322 will be compressed a greater amount. In both situations, springs 324 and 326 keep contact casings 328 and 330 in contact with conductor 102.

In accordance with one embodiment, base 308 is fastened to insulated conductor 100 using an adhesive 400 between the bottom surface of base 308 and insulator 104. After sensor 300 has been mounted on insulated conductor 100, it can be wrapped with a dielectric wrap 402 to electrically insulate the exterior of sensor module 300.

After sensor module 300 has been mounted on insulated conductor 100, pins 320 and 322 maintain the common voltage of sensor module 300 at the same voltage as found on conductor 102. As a result, the common voltage does not lead or lag the voltage on conductor 102 and partial discharge through insulator 104 is eliminated.

FIG. 5 provides a top perspective view and FIG. 6 provides a bottom perspective view of sensor module/sensor package 300 of FIGS. 3 and 4. In FIG. 5, cover 310 is shown transparently and antenna 312 has been removed to provide a better view of the conductive traces and circuit components on the top of base 308. If antenna 312 were shown, it would connect to base 308 at openings 550 and 552. In the embodiment of FIG. 5, circuit component 314 is a surface acoustic wave (SAW) sensor and circuit component 316 is a resistor. In addition, an exemplary sensor module includes an inductor 518. The use of SAW sensors is the most preferred embodiment; however the disclosure also contemplates radio frequency identification (RFID) sensors, dielectric resonators, magnetic resonators, and other sensing elements that may be used for wireless sensing of energized electrical conductors.

Sensor module 300 includes conductive traces such as common voltage conductive trace 530 and additional traces 532 and 534, where common voltage conductive trace 530 includes all traces connected to the line referenced by reference number 530. In accordance with one embodiment, the conductive traces are formed by depositing a layer of copper alloy in a pattern that electrically isolates the different conductive traces from each other.

In addition to spring-loaded pins 320 and 322, sensor module 300 is shown to include spring-loaded pins 520 and 522, which are also connected to common voltage conductive trace 530. Pins 520 and 522 are similar to pins 320 and 322 and operate in a manner identical to the manner discussed above for pins 320 and 322. As shown in FIG. 5, the heads of pins 520 and 320 are exposed such that an ohmmeter can be placed between either of the two pins and the conductor 102 to determine if the pins are conductively attached to conductor 102. Contact casings 523 and 525 of pins 520 and 522 are shown in FIG. 6. In an alternate embodiment, pins 520 and 320 are absent, but a metal pad connected to common voltage conductive trace 530 is exposed and electrical resistance between said pad 560 and insulated conductor 102 is measured to verify the conductive attachment of common voltage conductive trace 530 to insulated conductor 102.

Figure 7:
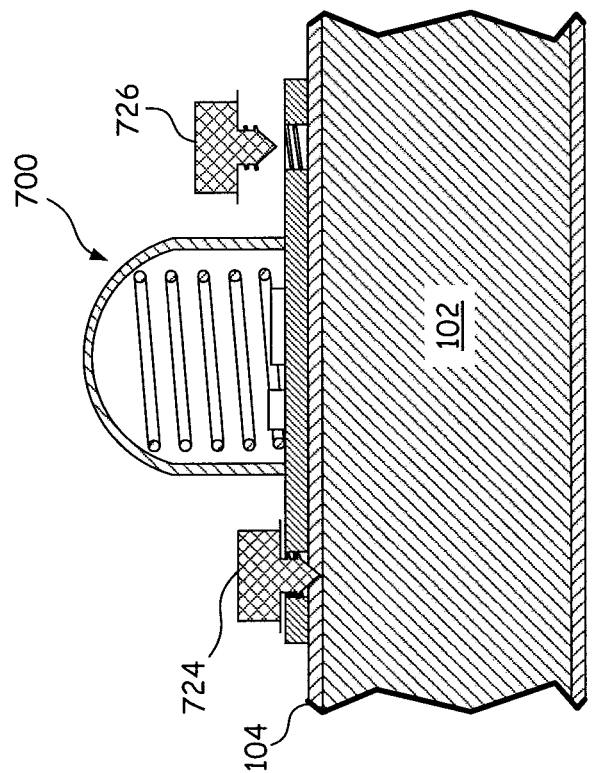
FIG. 7 is a sectional view of a second embodiment of a sensor module before being mounted to an insulated conductor.

FIG. 7 shows a sectional view of a sensor module 700 of a second embodiment. Sensor module 700 includes a base 708 supporting a cover 710, circuit components 714 and 716 and an antenna 712. Circuit components 714 and 716 and antenna 712 are mounted within cover 710 and are electrically connected to conductive traces on the top surface of base 708. Component 714 includes at least one sensor such as a temperature sensor, a humidity sensor or a partial discharge sensor, for example. In accordance with some embodiments, the sensor is a surface acoustic wave sensor. The use of SAW sensors is the most preferred embodiment; however the disclosure also contemplates radio frequency identification (RFID) sensors, dielectric resonators, magnetic resonators, and other sensing elements that may be used for wireless sensing of energized electrical conductors. Antenna 712 receives and transmits electromagnetic signals to allow for wireless communication between sensor module 700 and external devices. In addition, some of the energy in the received electromagnetic signals is used to power sensor module 700 such that sensor module 700 does not require a battery. The conductive traces on the top surface of base 708 include a common voltage or circuit ground conductive trace.

Base 708 includes two threaded holes 711 and 713 and two extensions 724 and 726 in the foal) of threaded screws with piercing ends 720 and 722. Conductive traces for the common voltage extend out and around threaded holes 711 and 713 such that when screws 724 and 726 are screwed into threaded holes 711 and 713, they make an electrical connection to the conductive traces.

Figure 8:
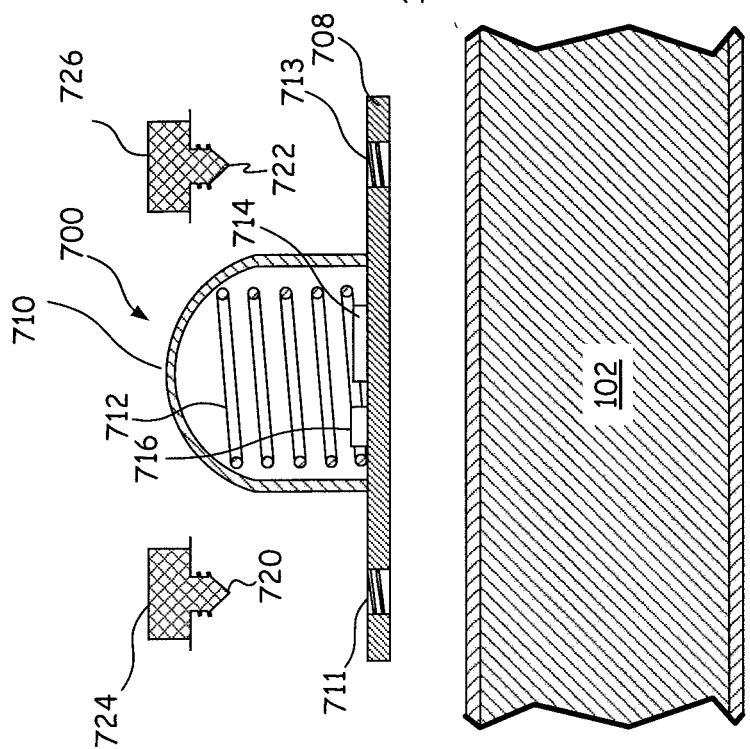
FIG. 8 shows the sensor module of FIG. 7 during the process of mounting.

As shown in FIG. 8, when base 708 is placed on insulator 104 and threaded screw 724 is screwed into threaded opening 711, piercing end 720 of screw 724 pierces insulator 104 to form an opening in insulator 104. Screw 724 extends through this opening and contacts conductor 102 to thereby provide a conduction path between conductor 102 and the conductive trace for the common voltage. Similarly, when screw 726 is screwed into opening 711, piercing end 722 of screw 726 pierces insulator 104 to form an opening through the thickness of insulator 104. Screw 726 extends through this opening and contacts conductor 102, thereby providing a conduction path between conductor 102 and the common voltage conductive trace. These conduction paths maintain the common voltage at the voltage of conductor 102.

Figure 9:
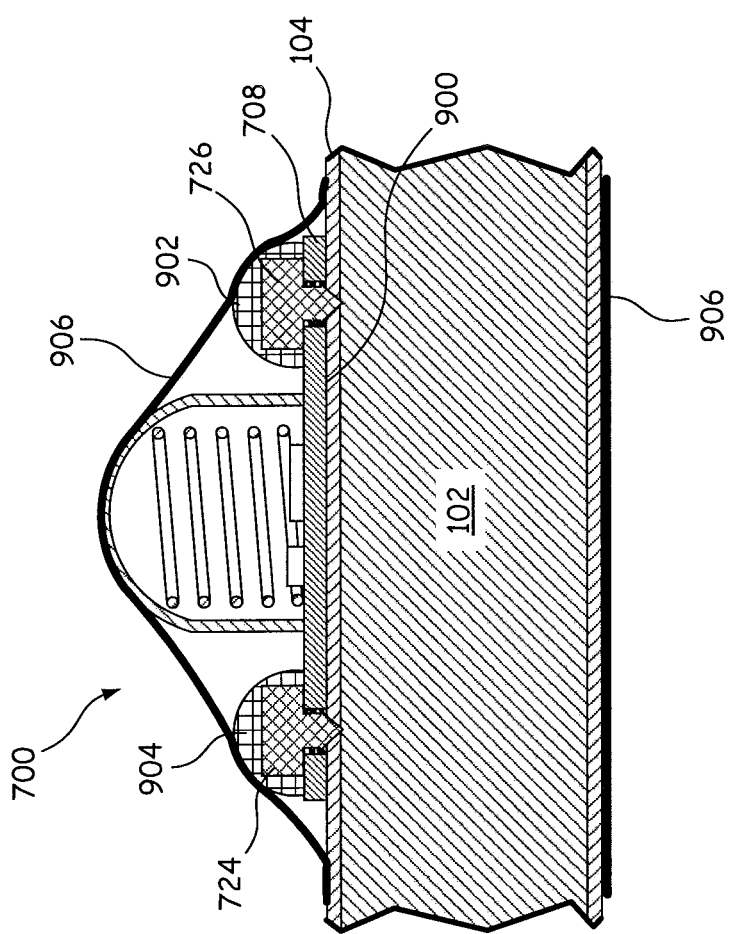
FIG. 9 shows the sensor module of FIG. 7 fully mounted to the insulated conductor.

As shown in FIG. 9, in some embodiments, base 708 is fastened to insulator 104 with an adhesive layer 900 prior to screws 724 and 726 being screwed into insulator 104. In some embodiments, after screws 724 and 726 are screwed into base 708 and pierce insulator 104, adhesive layers 902 and 904 are applied over screws 724 and 726, respectively, to electrically insulate the tops of screws 724 and 726. In further embodiments, a dielectric tape 906 is wrapped around sensor module 700 to further insulate sensor module 700.

FIG. 10 shows a sectional view of a sensor module 1000 of a third embodiment. Sensor module 1000 includes a base 1008 supporting a cover 1010, circuit components 1014 and 1016 and an antenna 1012. Circuit components 1014 and 1016 and antenna 1012 are mounted within cover 1010 and are electrically connected to conductive traces on the top surface of base 1008. Component 1014 includes at least one sensor such as a temperature sensor, a humidity sensor or a partial discharge sensor, for example. In accordance with some embodiments, the sensor is a surface acoustic wave sensor. The use of SAW sensors is the most preferred embodiment; however the disclosure also contemplates radio frequency identification (RFID) sensors, dielectric resonators, magnetic resonators, and other sensing elements that may be used for wireless sensing of energized electrical conductors. Antenna 1012 receives and transmits electromagnetic signals to allow for wireless communication between sensor module 1000 and external devices. In addition, some of the energy in the received electromagnetic signals is used to power sensor module 1000 such that sensor module 1000 does not require a battery. The conductive traces on the top surface of base 1008 include a common voltage or circuit ground conductive trace.

A conductive layer 1052 having a spike 1054 is mounted to a bottom surface of base 1008. Conductive layer 1052 is electrically connected to a conductive coating 1050 on an interior surface of a via 1048 between the bottom surface of base 1008 and conductive traces on the top surface of base 1008.

As sensor module 1000 is mounted on insulator 104 of insulated conductor 100, spike 1054 pierces insulator 104 to form an opening in insulator 104 and extends through this opening and the thickness of insulator 104 to make contact with conductor 102. In this manner, spike 1054 acts as an extension that provides a conductive path from conductor 102 to the common voltage conductive trace through conductive layer 1052 and conductive coating 1050. Sensor module 1000 can be fastened to insulator 104 with an adhesive 1100 and/or can be fastened to insulated conductor 100 using a tie or strap 1102. In addition, a dielectric wrapping 1104 can be wrapped around the exterior of sensor module 1000 and insulator 104 to further insulate the exterior of sensor module 1000.

FIG. 12 provides a sectional view of a sensor module 1200 in accordance with a fourth embodiment. Sensor module 1200 includes a base 1208 supporting a cover 1210, circuit components 1214 and 1216 and an antenna 1212. Circuit components 1214 and 1216 and antenna 1212 are mounted within cover 1210 and are electrically connected to conductive traces on the top surface of base 1208. Component 1214 includes at least one sensor such as a temperature sensor, a humidity sensor and a partial discharge sensor, for example. In accordance with some embodiments, the sensor is a surface acoustic wave sensor. The use of SAW sensors is the most preferred embodiment; however the disclosure also contemplates radio frequency identification (RFID) sensors, dielectric resonators, magnetic resonators, and other sensing elements that may be used for wireless sensing of energized electrical conductors. Antenna 1212 receives and transmits electromagnetic signals to allow for wireless communication between sensor module 1200 and external devices. In addition, some of the energy in the received electromagnetic signals is used to power sensor module 1200 such that sensor module 1200 does not require a battery. The conductive traces on the top surface of base 1208 include a common voltage or circuit ground conductive trace.

An electrically conductive extension 1220 is mounted to a bottom surface of base 1208 and includes a bend or clip 1224 having an end 1222. End 1222 of clip 1224 is inserted between insulator 104 and conductor 102 at an opening in insulator 104 fornied where conductor 102 extends past an end 1260 of insulator 104. Thus, conductive extension 1220 extends through the opening in insulator 104 so that end 1222 is between insulator 104 and conductor 102 and is in contact with conductor 102.

A conductive coating 1250 on the interior surface of a via 1248 between the common voltage conductive trace on the top of base 1208 and the bottom of base 1208 provides a conductive path between the common voltage conductive trace and conductive extension 1220. As a result, conductive extension 1220 provides a conductive path between conductor 102 and the common voltage conductive trace. In accordance with one embodiment, a dielectric wrap 1270 is wrapped around sensor module 1200 and insulated conductor 100 to further insulate the exterior of sensor module 1200. In at least some embodiments extension 1220 comprises a wire.

Figure 13:
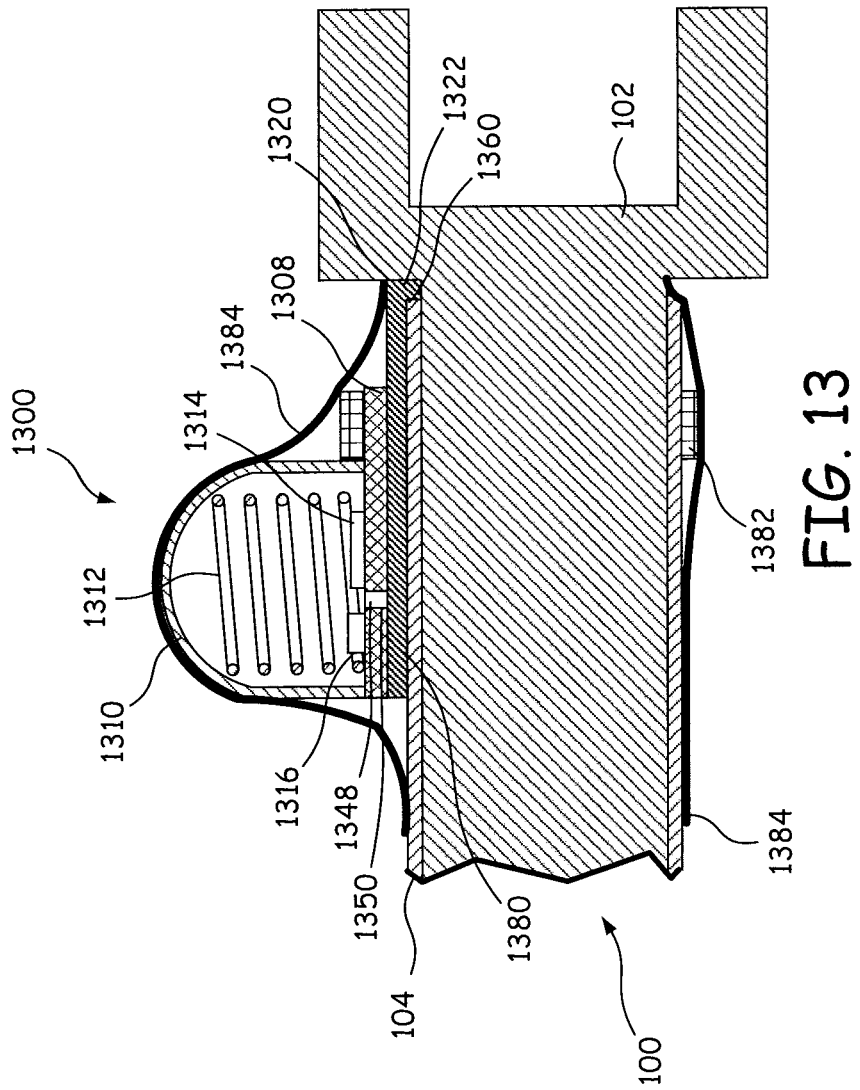
FIG. 13 shows a sectional view of a fifth embodiment of the sensor module fully mounted to an insulated conductor.

FIG. 13 provides a sectional view of a sensor module 1300 in accordance with a fifth embodiment. Sensor module 1300 includes a base 1308 supporting a cover 1310, circuit components 1314 and 1316 and an antenna 1312. Circuit components 1314 and 1316 and antenna 1312 are mounted within cover 1310 and are electrically connected to conductive traces on the top surface of base 1308. Component 1314 includes at least one sensor such as a temperature sensor, a humidity sensor and a partial discharge sensor, for example. In accordance with some embodiments, the sensor is a surface acoustic wave sensor. The use of SAW sensors is the most preferred embodiment; however the disclosure also contemplates radio frequency identification (RFID) sensors, dielectric resonators, magnetic resonators, and other sensing elements that may be used for wireless sensing of energized electrical conductors. Antenna 1312 receives and transmits electromagnetic signals to allow for wireless communication between sensor module 1300 and external devices. In addition, some of the energy in the received electromagnetic signals is used to power sensor module 1300 such that sensor module 1300 does not require a battery. The conductive traces on the top surface of base 1308 include a common voltage or circuit ground conductive trace.

The bottom surface of base 1308 is mounted to a conductive extension 1320 having a downward extending leg 1322. When mounted on an insulated conductor 100, downward extending leg 1322 extends through an opening in an insulator 104 formed where conductor 102 extends past an end 1360 of insulator 104. In at least some embodiments extension 1320 comprises a wire. In a preferred embodiment, edge 1360 exposing conductor 102 is at least partially covered with a conductive adhesive such as a silver loaded RTV silicone.

Base 1308 includes a via 1348 that is coated with a conductive layer 1350 providing an electrical connection between conductive extension 1320 and the common voltage conductive trace on the top surface of base 1308. Thus, conductive extension 1320 provides a conductive path from conductor 102 to the common voltage conductive trace on the top surface of base 1308.

Sensor module 1300 can be fastened to insulated conductor 100 using a tie or strap 1382 and/or using an adhesive 1380. In addition, a dielectric wrap 1384 is wrapped around insulated conductor 100 and sensor module 1300 to further insulate the exterior of sensor module 1300 in some embodiments.

In accordance with further embodiments, conductive extension 1320 is replaced with a wire that provides an electrical connection between the conducive traces of the sensor module and insulated conductor 102 through a corresponding opening in the insulator 104 formed where conductor 102 extends past an end 1360 of insulator 104.

FIG. 14 provides a sectional view of a sensor module 1400 in accordance with a sixth embodiment. Sensor module 1400 includes a base 1408 supporting a cover 1410, circuit components 1414 and 1416 and an antenna 1412. Circuit components 1414 and 1416 and antenna 1412 are mounted within cover 1410 and are electrically connected to conductive traces on the top surface of base 1408. Component 1414 includes at least one sensor such as a temperature sensor, a humidity sensor and a partial discharge sensor, for example. In accordance with some embodiments, the sensor is a surface acoustic wave sensor. The use of SAW sensors is the most preferred embodiment; however the disclosure also contemplates radio frequency identification (RFID) sensors, dielectric resonators, magnetic resonators, and other sensing elements that may be used for wireless sensing of energized electrical conductors. Antenna 1412 receives and transmits electromagnetic signals to allow for wireless communication between sensor module 1400 and external devices. In addition, some of the energy in the received electromagnetic signals is used to power sensor module 1400 such that sensor module 1400 does not require a battery. The conductive traces on the top surface of base 1408 include a common voltage or circuit ground conductive trace. Base 1408 that includes at least one via 1448 having an interior surface that is coated with a conductive coating 1450. Conductive coating 1450 is electrically connected to the common voltage conductive trace on the top surface of base 1408 and to a conductive layer on the bottom surface of base 1408.

A conductive extension in the form of a conductive slug or spring 1452 is sized to fit within an opening 1454 made in insulator 104 and thus extend through the opening and the thickness of insulator 104 that defines opening 1454. The height of slug 1452 is slightly greater than the thickness of insulator 104 such that when a bottom surface of slug 1452 contacts conductor 102, a top surface of slug 1452 is slightly above the top surface of insulator 104. In a preferred embodiment, hole 1454 is at least partially filled with a conductive adhesive such as a silver loaded RTV silicone. In at least one embodiment, conductive slug 1452 is formed in place from a compliant, conductive adhesive such as silver loaded RTV silicone.

As shown in FIG. 15, sensor module 1400 is secured to insulated conductor 100 by placing extension slug 1452 into opening 1454 and then fastening the remainder of sensor module 1400 to insulated conductor 100 using an adhesive 1500 and/or a tie or strap 1502. Sensor module 1400 is fastened to insulated conductor 100 such that via 1448 is positioned immediately above slug 1452, or in close proximity thereto, so that the conductive top surface of slug 1452 is in contact with the part of conductive coating 1450. As a result, slug 1452 provides a conductive path from conductor 102 to the common voltage conductive trace on the top surface of base 1408 through conductive coating 1450. Examples of the metal slug include a domed sheet of spring brass, a spring coil, or a solid piece of metal, for example.

In accordance with some embodiments, methods are provided for securing a sensor module to an insulated conductor such that a portion of the sensor module makes galvanic contact with the conductor. The methods include making openings in the insulation of the insulated conductor and placing spring-loaded pins of the sensor module within the openings so that the pins make galvanic contact with the conductor. The sensor module is then fastened to the insulated conductor with one or more of an adhesive and a tie down. In other embodiments, a threaded screw is threaded into a base of a sensor module so that a piercing end of the screw pierces the insulation on an insulated conductor and makes galvanic contact with the conductor. Each screw is further in contact with a conductive trace for a common voltage on the sensor module.

In accordance with a further embodiment, as a sensor module is fastened to an insulated conductor, a spike on a bottom of the sensor module pierces the insulator of the insulated conductor to make galvanic contact with the conductor. In still further embodiments, the sensor module is fastened to an insulator of the insulated conductor such that a portion of the sensor module extends over an end of the insulator to make galvanic contact with a portion of the conductor that extends past the insulator. In a still further embodiment, a portion of the sensor module is inserted between an insulator of the insulated conductor and the conductor at an end of the insulator.

In a still further embodiment, an opening is created in the insulator of the insulated conductor and a conductive slug is placed in the opening. A base of the sensor module is then fastened to the insulator such that the base makes galvanic contact with the slug, which in turn makes galvanic contact with the conductor.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are disclosed as example thin's for implementing the claims.

What is claimed is:

1. A sensor package comprising:
at least one conductive trace providing a voltage common;
wireless sensor circuitry coupled to the at least one conductive trace configured to sense a parameter of a high voltage electrical power asset;
an antenna coupled to the wireless sensor;
a base supporting the at least one conductive trace configured to mount to an insulator which surrounds a conductor of an insulated conductor of the high voltage electrical power asset which carries an alternating voltage, wherein the alternating voltage induces a voltage differential between the wireless sensor circuitry and the conductor; and
a conductive extension, extending from the base so as to contact the conductor of the insulated conductor when the sensor package is mounted on the insulator of the insulated conductor and thereby provide an electrical connection between the conductive trace providing the voltage common and the conductor to thereby eliminate the voltage differential between the wireless sensor circuitry and the conductor.

2. The sensor package of claim 1 wherein the extension comprises a spike extending from the sensor package and capable of piercing the insulator as the sensor package is mounted on the insulator.

3. The sensor package of claim 1 wherein the base comprises a threaded opening and the extension comprises a threaded screw capable of piercing the insulator as the threaded screw is screwed into the threaded opening.

4. The sensor package of claim 1 wherein the extension comprises a pin extending from the sensor package such that the pin passes through an opening in the insulator when the sensor package is mounted on the insulator.

5. The sensor package of claim 4 wherein the pin comprises a spring-loaded pin having an end that retracts as the sensor package is mounted through an opening in the insulator onto the conductor.

6. The sensor package of claim 4 wherein the base further comprises a top surface and wherein a top of the pin is exposed at the top surface of the base.

7. The sensor package of claim 4 wherein the pin contacts the conductive trace providing the voltage common.

8. The sensor package of claim 1 wherein the extension comprises an arm that contacts a portion of the conductor that extends outside of the insulator when the sensor package is mounted to the insulator.

9. The sensor package of claim 1 wherein the extension comprises a clip having an end that is inserted between the insulator and the conductor at an end of the insulator when the sensor package is mounted to the insulator.

10. The sensor package of claim 1 wherein the insulated conductor comprises a portion of a circuit breaker.

11. The sensor package of claim 1 wherein the extension has a top surface in contact with a surface of the base and a bottom surface in contact with the conductor when the extension is placed in a hole in the insulator and the base is mounted to the insulator.

12. The sensor package of claim 1 further comprising a surface acoustic wave sensor.

13. The sensor package of claim 1 further comprising an RFID sensor.

14. A sensor module comprising:
a conductive trace layer comprising an electrical common conductive trace;
an electrical component connected to the electrical common conductive trace;
a base supporting the conductive trace layer and the electrical component, configured to mount to an insulator which surrounds a conductor of an insulated conductor of a high voltage electrical power asset which carries an alternating voltage, wherein the alternating voltage induces a voltage differential between the electrical component and the conductor; and
a conductive extension configured to extend through an opening in the insulator of the insulated conductor to make a connection between the conductor of the insulated conductor and the electrical common conductive trace to thereby eliminate the voltage differential between the electrical component and the conductor.

15. The sensor module of claim 14 wherein the insulated conductor comprises a portion of a breaker for medium voltage power.

16. The sensor module of claim 14 wherein the conductive extension comprises a spike capable of piercing the insulator as the sensor module is mounted on the insulator to form the opening in the insulator and to make the connection with the conductor.

17. The sensor module of claim 14 wherein the sensor module further comprises a base comprising a threaded opening and the extension comprises a threaded screw capable of piercing the insulator as the threaded screw is screwed into the threaded opening to thereby form the opening in the insulator and make the connection with the conductor.

18. The sensor module of claim 14 wherein the sensor module further comprises a base and the extension comprises a pin extending from a surface of the base such that the pin passes through the opening in the insulator when the base is mounted on the insulator.

19. The sensor module of claim 18 wherein the pin comprises a spring-loaded pin having an end that retracts as the base is mounted through a hole in the insulator and makes the connection with the conductor.

20. The sensor module of claim 18 wherein the base further comprises a top surface and wherein a top of the pin is exposed at the top surface of the base.

21. The sensor module of claim 18 wherein the pin contacts the electrical common conductive trace.

22. The sensor module of claim 14 wherein the opening in the insulator comprises an end of the insulator and the conductive extension comprises an arm configured to extend along an exterior of the insulator and contact a portion of the conductor that extends outside of the end of the insulator.

23. The sensor module of claim 14 wherein the opening of the insulator comprises an end of the insulator and the conductive extension comprises a clip having an end that is inserted between the insulator and the conductor at the end of the insulator.

24. The sensor module of claim 14 further comprising a base wherein the conductive extension has a top surface in contact with a surface of the base and a bottom surface in contact with the conductor when the conductive extension is placed in the opening in the insulator and the base is mounted to the insulator.

25. The sensor package of claim 14 wherein the at least one electrical component comprises a surface acoustic wave sensor.

26. The sensor package of claim 14 wherein the conductive extension comprises a wire.

27. A method comprising:
securing a sensor module to an insulated conductor of a high voltage electrical asset such that a portion of the sensor module makes contact with a conductor of the insulated conductor;
wirelessly transmitting a measured parameter of the high voltage electrical asset using a sensor;
inductively coupling to an alternating voltage carried in the conductor and inducing a voltage differential between the sensor and the conductor; and
eliminating the voltage differential between the sensor and the conductor through the contact between the sensor module and the conductor.

28. The method of claim 27 wherein securing the sensor module comprises:

creating a hole in an insulator of the insulated conductor;
placing a pin of the sensor module in the hole; and
fastening the sensor module to the insulator.

29. The method of claim 28 wherein at least one of placing the pin and fastening the sensor module comprises causing a spring in the pin to compress.

30. The method of claim 27 wherein securing the sensor module comprises:
placing the sensor module on an insulator of the insulated conductor;
screwing a threaded screw into and through the sensor module such that the threaded screw pierces the insulator to make contact with the conductor.

31. The method of claim 27 wherein securing the sensor module comprises:
placing the sensor module on an insulator of the insulated conductor;
fastening the sensor module to the insulated conductor such that a spike on the sensor module pierces the insulator to make contact with the conductor.

32. The method of claim 27 wherein securing the sensor module comprises:
inserting a portion of the sensor module between an insulator of the insulated conductor and the conductor at an end of the insulator.

33. The method of claim 27 wherein securing the sensor module comprises:
fastening the sensor module on an insulator of the insulated conductor such that a portion of the sensor module extends past an end of the insulator to make contact with a portion of the conductor that extends past the end of the insulator.

34. The method of claim 27 wherein securing the sensor module comprises:
creating a hole in an insulator of the insulated conductor;
placing a slug of conductive material in the hole such that the slug makes contact with the conductor; and
fastening a base of the sensor module to the insulator such that the base makes contact with the slug.

35. A sensor package comprising:
at least one conductive trace providing a voltage common;
a base supporting the at least one conductive trace;
a conductive extension, extending from the base so as to contact a conductor of an insulated conductor when the sensor package is mounted on an insulator of the insulated conductor and thereby provide an electrical connection between the conductive trace providing the voltage common and the conductor; and
wherein the extension comprises a pin extending from the sensor package such that the pin passes through an opening in the insulator when the sensor package is mounted on the insulator.

36. A sensor module comprising:
a conductive trace layer comprising an electrical common conductive trace;
an electrical component connected to the electrical common conductive trace;
a conductive extension configured to extend through an opening in an insulator of an insulated conductor to make a connection between a conductor of the insulated conductor and the electrical common conductive trace; and
wherein the sensor module further comprises a base and the extension comprises a pin extending from a surface of the base such that the pin passes through the opening in the insulator when the base is mounted on the insulator.

37. A method comprising:
securing a sensor module to an insulated conductor such that a portion of the sensor module makes contact with a conductor of the insulated conductor;
wherein securing the sensor module comprises:
creating a hole in an insulator of the insulated conductor;
placing a pin of the sensor module in the hole; and
fastening the sensor module to the insulator.

* * * * *